US009553031B1

(12) United States Patent
Besser et al.

(10) Patent No.: US 9,553,031 B1
(45) Date of Patent: Jan. 24, 2017

(54) METHOD FOR INTEGRATING GERMANIDES IN HIGH PERFORMANCE INTEGRATED CIRCUITS

(71) Applicant: Lam Research Corporation, Fremont, CA (US)

(72) Inventors: Paul Raymond Besser, Sunnyvale, CA (US); Thorsten Lill, Santa Clara, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/088,498

(22) Filed: Apr. 1, 2016

(51) Int. Cl.
| | |
|---|---|
| H01L 21/8238 | (2006.01) |
| H01L 27/092 | (2006.01) |
| H01L 29/06 | (2006.01) |
| H01L 29/10 | (2006.01) |
| H01L 29/423 | (2006.01) |
| H01L 29/786 | (2006.01) |
| H01L 21/8234 | (2006.01) |

(52) U.S. Cl.
CPC ......... *H01L 21/823807* (2013.01); *H01L 21/823412* (2013.01); *H01L 21/823821* (2013.01); *H01L 27/092* (2013.01); *H01L 29/0673* (2013.01); *H01L 29/1054* (2013.01); *H01L 29/42392* (2013.01); *H01L 29/78684* (2013.01); *H01L 29/78696* (2013.01)

(58) Field of Classification Search
CPC .......... H01L 21/02225; H01L 21/02227; H01L 21/02365; H01L 21/02518; H01L 21/70; H01L 21/8232
See application file for complete search history.

(56) References Cited

U.S. PATENT DOCUMENTS

| | | | | |
|---|---|---|---|---|
| 2007/0057347 A1* | 3/2007 | Ikeda | ............... | H01L 21/2254 257/616 |
| 2007/0215918 A1* | 9/2007 | Ito | ............... | H01L 21/823814 257/288 |
| 2013/0105897 A1* | 5/2013 | Bangsaruntip | ......... | B82Y 10/00 257/351 |

OTHER PUBLICATIONS

Dimoulas, A., et al., "Fermi-level pinning and charge neutrality level in germanium;" Applied Physics Letters 89, 252110 (2006); 4 Pages.
Nishimura, Tomonori, et al., "Evidence for Strong Fermi-level pinning due to metal-induced gap states at metal/germanium interface;" Applied Physics Letters 91, 123123 (2007); 4 Pages.
Thathachary, Arun V., et al., "Fermi level depinning at the germanium Schottky interface through sulfur passivation;" Applied Physics Letters 96, 152108 (2010); 4 Pages.
Ion Beam Services "PULSION: Plasma Implant Update", SemiCon SFO; Jul. 2015; 74 Pages.

* cited by examiner

*Primary Examiner* — Cheung Lee (57) ABSTRACT

A method for making an integrated circuit includes a) providing a substrate including n-type metal oxide semiconductor field effect transistors (NMOSFETs) and p-type metal oxide semiconductor field effect transistors (PMOSFETs), wherein channel regions of the NMOSFETs and the PMOSFETs include germanium; b) depositing and patterning a mask layer to mask the channel regions of the PMOSFETs and to not mask the channel regions of the NMOSFETs; c) passivating an exposed surface of the substrate; d) removing the mask layer; and e) depositing a metal contact layer on both the NMOSFETs and the PMOSFETs.

23 Claims, 8 Drawing Sheets

S=1: Ideal Schottky Limit, Fermi Level is unpinned

METHOD FOR INTEGRATING GERMANIDES IN HIGH PERFORMANCE INTEGRATED CIRCUITS

FIELD

The present disclosure relates to substrate processing methods, and more particularly to methods for integrating germanium in high performance integrated circuits.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

P-channel metal oxide semiconductor field effect transistors (PMOSFETs) and n-channel MOSFETs (NMOSFETs) are used in many high performance integrated circuits. Reducing contact resistance is important for further improving performance. While nickel silicide (NiSi) provides good contact resistance, NiSi includes Si which is a mid-gap work function material (0.65 eV) (similar to cobalt (Co) and titanium (Ti)) and is prone to form pipes of $NiSi_2$, which limits performance.

A metal insulator silicon (MIS) structure has also been used to reduce contact resistance. However, the insulator (typically titanium dioxide ($TiO_2$) or silicon dioxide ($SiO_2$)) does not remain stable during subsequent processing.

Another approach for reducing contact resistance uses Ti metal in direct contact with Si. The Ti metal is deposited using physical vapor deposition (PVD) and requires a titanium nitride (TiN) cap deposited using chemical vapor deposition (CVD). As contact dimensions scale, the TiN cap consumes much of the contact fill and has high resistance. Manufacturers have resorted to expensive integration techniques to etch back the high resistance TiN cap and fill the contact and/or metal gate with a lower resistance metal. Both the interface resistance and contact material resistance need to be reduced.

In dual silicide integration, providing low contact resistance for NMOSFETs and PMOSFETs involves the use of different materials. Dual silicide integration was actively researched to reduce resistance between the silicide and the silicon. In this integration, a work function of the silicide is tailored to reach the band edge. The candidates are: PMOSFETs>0.8 eV using iridium (Ir), platinum (Pt) or osmium (Os) and NMOSFETs<0.3 eV using erbium (Er), ytterbium (Yb), dysprosium (Dy) or gadolinium (Gd).

Other channel materials with higher carrier mobilities have been proposed to replace silicon (Si). For example, germanium (Ge) has higher electron and hole mobilities than Si. Ge is a group IV element (like Si) and is compatible with current manufacturing facilities.

Ge PMOSFETs have been demonstrated with good performance. However, Ge NMOSFETs have suffered from poor drive current due to high parasitic resistance. A metal Fermi level at metal/Ge interfaces is pinned close to a Ge valence band, which leads to a large barrier to n-type Ge and a high contact resistance ($R_s$). $R_s$ needs to be reduced in order to improve Ge NMOSFET performance and realize Ge devices.

SUMMARY

A method for making an integrated circuit includes a) providing a substrate including n-type metal oxide semiconductor field effect transistors (NMOSFETs) and p-type metal oxide semiconductor field effect transistors (PMOSFETs), wherein channel regions of the NMOSFETs and the PMOSFETs include germanium; b) depositing and patterning a mask layer to mask the channel regions of the PMOSFETs and to not mask the channel regions of the NMOSFETs; c) passivating an exposed surface of the substrate; d) removing the mask layer; and e) depositing a metal contact layer made of a single metal material on both the NMOSFETs and the PMOSFETs.

In other features, after d) and before e), depositing an oxide film on the channel regions of the NMOSFETs and the PMOSFETs. Passivating the substrate comprises implanting ions selected from a group consisting of sulfur ions and selenium ions in the channel regions of the NMOSFETs. Passivating the substrate comprises performing a substrate treatment selected from a group consisting of ammonium sulfide (($NH_4)_2S$) and thiol-based self-assembled monolayers (SAMs). Passivating the substrate comprises performing a substrate treatment using a liquid selected from a group consisting of dissolved selenium chloride, selenium oxyfluoride and selenium oxychloride. Passivating the substrate comprises exposing the substrate to plasma gas chemistry selected from a group consisting of hydrogen sulfide ($H_2S$) and hydrogen selenide ($H_2Se$).

In other features, the PMOSFETS and the NMOSFETs include FINFETs. The PMOSFETS and the NMOSFETs include gate all around (GAA) transistors. The channel regions include strained germanium. The channel regions include silicon germanium having a germanium concentration greater than or equal to 85%.

A method for making an integrated circuit includes a) providing a substrate including n-type metal oxide semiconductor field effect transistors (NMOSFETs) and p-type metal oxide semiconductor field effect transistors (PMOSFETs), wherein channel regions of the NMOSFETs and the PMOSFETs are made of germanium; b) depositing a metal contact layer made of a single metal material over the channel regions of both the NMOSFETs and the PMOSFETs; c) depositing and patterning a mask layer on the metal contact layer to mask the channel regions of the PMOSFETs and to not mask the channel regions of the NMOSFETs; and d) passivating the channel regions of the NMOSFETs and not passivating the channel regions of the PMOSFETs.

In other features, the method includes removing the mask layer. After a) and before b), depositing an oxide film on the channel regions of the NMOSFETs and the PMOSFETs. Passivating the channel regions of the NMOSFETs comprises implanting ions selected from a group consisting of sulfur ions and selenium ions in the channel regions of the NMOSFETs through the metal layer. The PMOSFETS and the NMOSFETs include FINFETs. The PMOSFETS and the NMOSFETs include gate all around (GAA) transistors.

In other features, the channel regions include strained germanium. The channel regions include silicon germanium having a germanium concentration greater than or equal to 85%.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
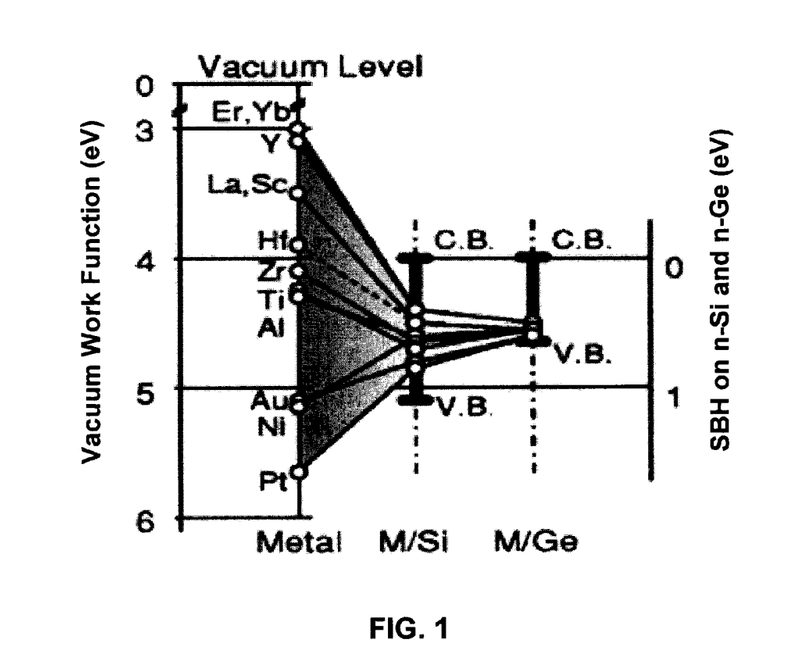
FIG. 1 is a graph illustrating metal Fermi levels for dual silicide integration.

As was described above, dual silicides can be realized on Si. The work function (Fermi Level) of the silicide is pinned by the contact material and tailored to reach the band edge. The candidates are: PMOSFET>0.8 eV=Ir, Pt, Os and NMOSFET<0.3 eV=Er, Yb, Dy, Gd. As shown in FIG. 1, this works well for Si as described by T. Nishimura, K. Kita, and A. Toriumi in Applied Physics Letter, 91, 123123 (2007). However, in the case of substrates using Ge, all metals contacting Ge fall within a narrow range within the band gap due to Fermi-level pinning.

Figure 2:
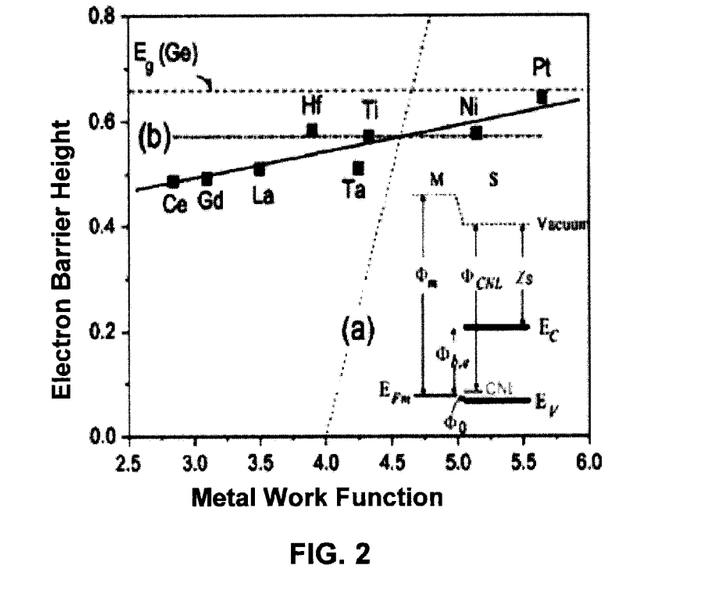
FIG. 2 is a graph illustrating electron barrier height as a function of metal work function.

Referring now to FIG. 2, electron barrier height is not modulated significantly by changing the metal work function and remains about 0.58 eV for Ge as described by A. Dimoulas, P. Tsipas, and A. Sotiropoulos in Applied Physics Letter 89, 252110 (2006).

Figure 3:
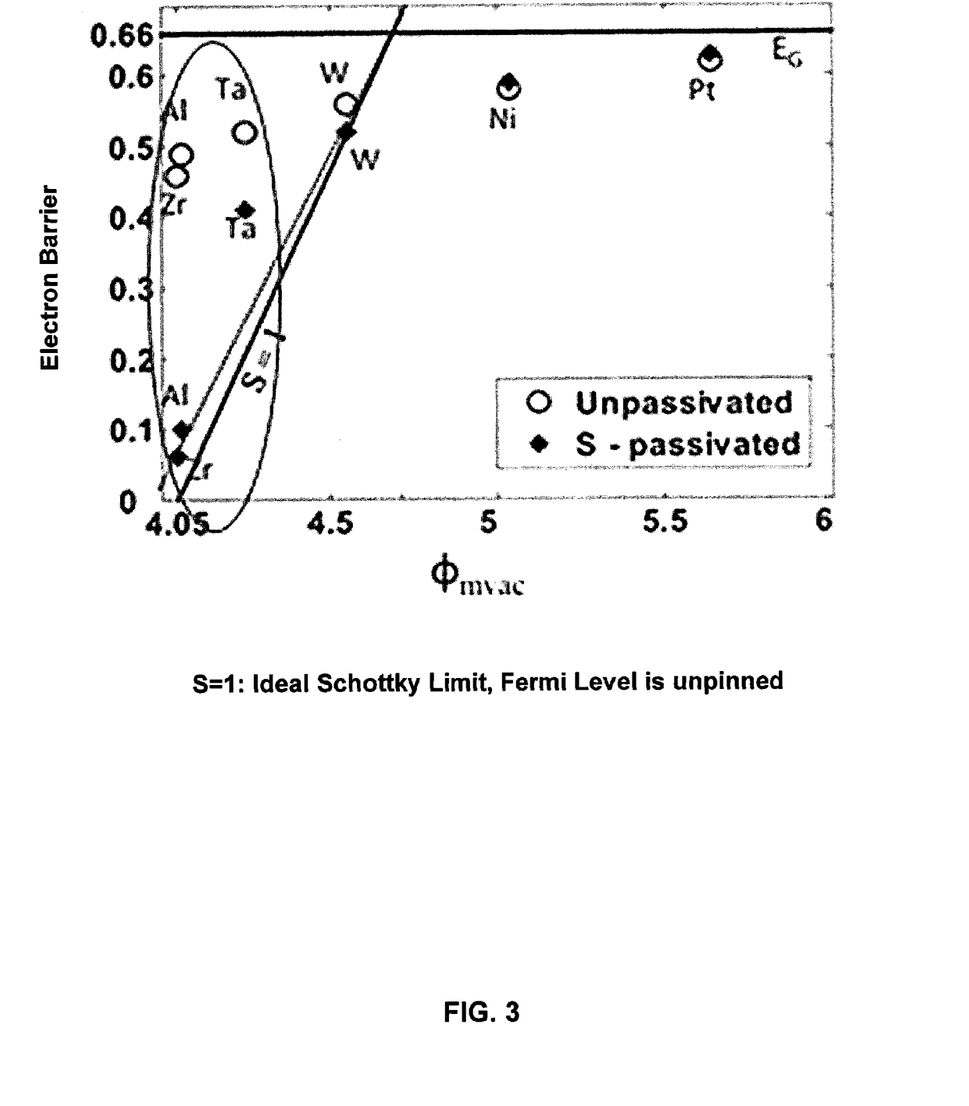
FIG. 3 is a graph illustrating ideal Schottky limits and Fermi level pinning.

Referring now to FIG. 3, if the N-type Ge can be passivated while the P-type Ge is unpassivated, then a single metal material can create two work functions (see circled region in FIG. 3). A Thathachary et al., Applied Physics Letter 96, 152108. This would create two barrier heights: one for N and one for P, while using a single contact metal. In some examples, the contact metal includes aluminum (Al), zirconium (Zr), tungsten (W) or tantalum (Ta), although other materials can be used. The N-type Ge can be passivated using sulfur (S) or selenium (Se) as will be described further below.

Figure 4A:
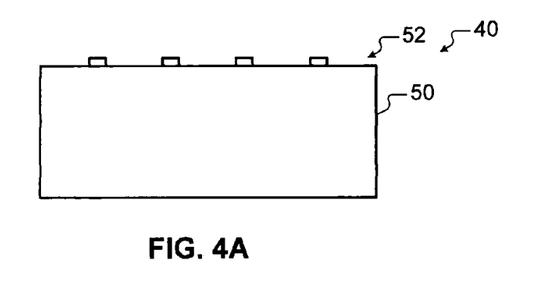
FIG. 4A is a side cross-sectional view of an example of a substrate including a silicon layer and a mask film layer according to the present disclosure.
Figure 4B:
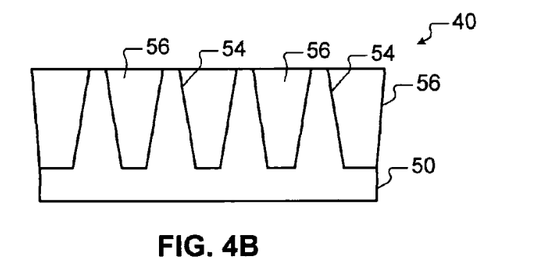
FIG. 4B is a side cross-sectional view of an example of the substrate after etching of trenches and deposition of film to form shallow trench isolation (STI) regions according to the present disclosure.

While the present disclosure will be described in the context of an STI-first integration approach in FIGS. 4A-7 below, an STI-last approach may also be used. Referring now to FIGS. 4A-4I, an example integration of germanides in high performance integrated circuits according to the present disclosure is shown. In FIG. 4A, a substrate 40 including a silicon layer 50 is shown. A mask film layer 52 is deposited and patterned to mask selected portions of the silicon layer 50. In FIG. 4B, the substrate 40 is shown after etching trenches 54 in the silicon layer 50. Film is deposited in the trenches 54 to create shallow trench isolation (STI) regions 56. For example, the film may include oxide such as silicon dioxide ($SiO_2$), although other materials may be used.

Figure 4C:
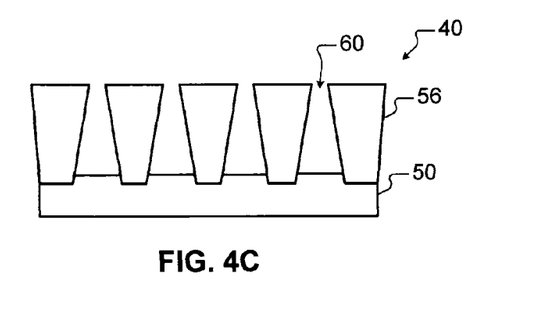
FIG. 4C is a side cross-sectional view of an example of the substrate after silicon is etched between the STI regions to create trenches according to the present disclosure.
Figure 4D:
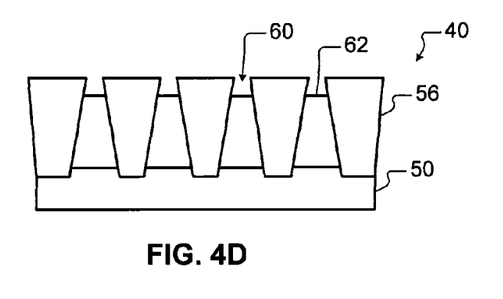
FIG. 4D is a side cross-sectional view of an example of the substrate after a first film is deposited in a lower portion of the trenches between the STI regions according to the present disclosure.

In FIG. 4C, the substrate 40 is shown after the silicon layer 50 is etched between the STI regions 56 to create trenches 60. In FIG. 4D, the substrate 40 is shown after a first film 62 is deposited in a lower portion of the trenches 60. In some examples, the first film 62 includes relaxed silicon germanium ($Si_{1-x}Ge_x$) film. An upper portion of the trenches 60 is not filled by the first film 62.

Figure 4E:
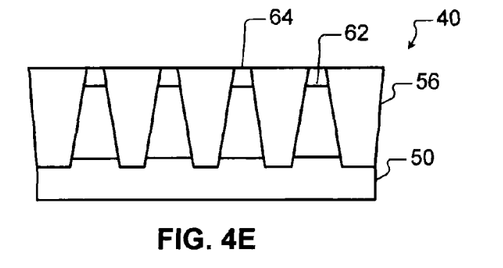
FIG. 4E is a side cross-sectional view of an example of the substrate after a second film is deposited in an upper portion of the trenches between STI regions according to the present disclosure.
Figure 4F:
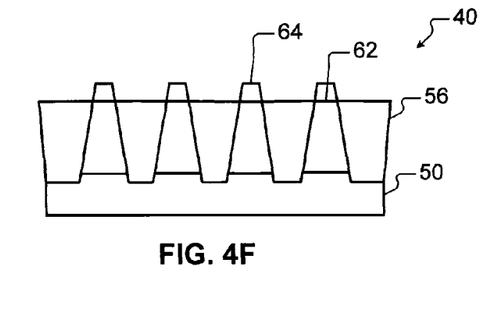
FIG. 4F is a side cross-sectional view of an example of the substrate after the STI regions are etched back to expose the second film according to the present disclosure.

In FIG. 4E, the substrate 40 is shown after a second film 64 is deposited in an upper portion of the trenches 60. In some examples, the second film 64 includes strained germanium (Ge) film. In other examples, the second film includes SiGe with Ge concentrations greater than or equal to 85%. In FIG. 4F, the substrate 40 is shown after the STI regions 56 are etched back to expose the second film 64.

Figure 4G:
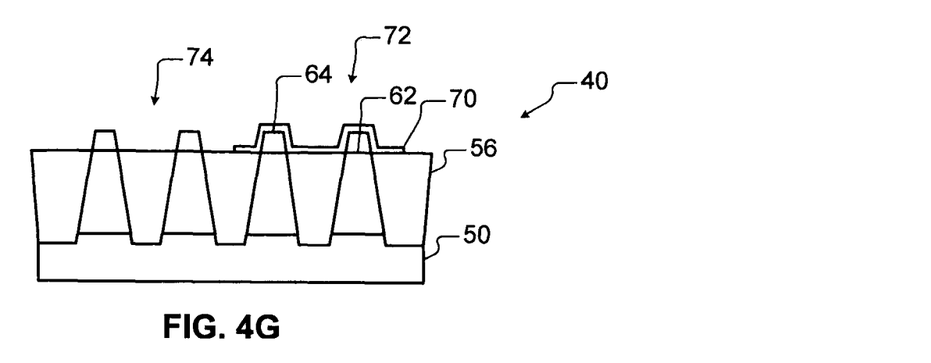
FIG. 4G is a side cross-sectional view of an example of the substrate after a mask film layer is deposited over the second film associated with PMOSFETs according to the present disclosure.

In FIG. 4G, the substrate 40 is shown after a mask film layer 70 is deposited and patterned over the second film 64 associated with PMOSFETs but not NMOSFETs. While the example in FIG. 4G shows two PMOSFETs 72 arranged adjacent to two NMOSFETs 74, other arrangements can be used. The mask film layer 70 is selected to protect the second film 64 of the PMOSFETs during subsequent selective passivation described below.

Figure 4H:
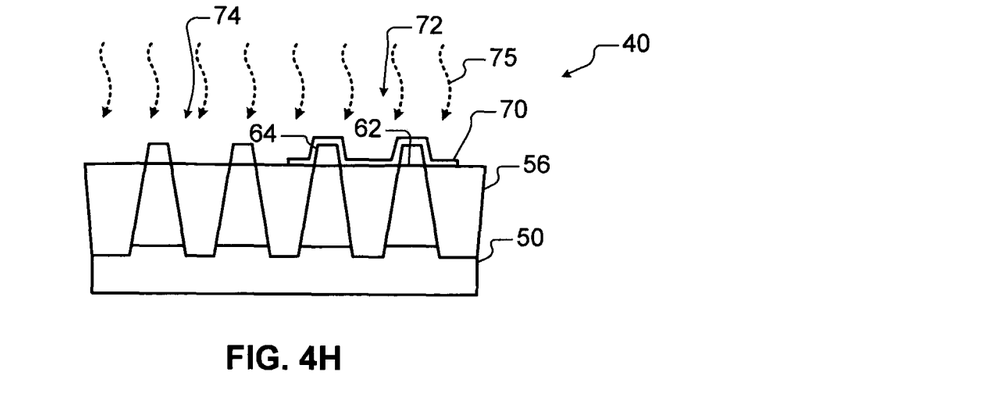
FIG. 4H is a side cross-sectional view of an example of the substrate during passivation of the second film associated with the NMOSFETs according to the present disclosure.

In FIG. 4H, the substrate 40 is shown during passivation 75 of the second film 64 associated with the NMOSFETs. In some examples, the passivation treatment includes using sulfur ion implantation, treatment using thiol-based self-assembled monolayers (SAMs), treatment using ammonium sulfide ($(NH_4)_2S$), or treatment using hydrogen sulfide ($H_2S$) plasma. In some examples, treatment using hydrogen sulfide ($H_2S$) plasma is performed using remote plasma or inductively coupled plasma (ICP). When using thiol-based SAMs, a carbon film may remain on the surface. The carbon film may be removed using plasma or handled during metal deposition. Some metals may absorb carbon without issue.

In some examples, passivation treatment includes using sulfur ion implantation according to a process described in "Plasma Implant Update", SemiCon San Francisco (July 2015), which is hereby incorporated by reference in its entirety. In other examples, the passivation may be performed using hydrogen selenide ($H_2Se$) plasma, Se ion implantation or exposure to Se-based salts such as $Se_2Cl_2$ (dissolved for liquid phase passivation), selenium oxyfluorides, and selenium oxychlorides. In some examples, treatment using $H_2Se$ plasma is performed using remote plasma or inductively coupled plasma (ICP).

In some examples, sulfurization treatment using $(NH_4)_2S$ includes treating the substrate to 40% aqueous ammonium sulfide $(NH_4)_2S$ solution at a predetermined temperature for a predetermined period. In some examples, the predetermined temperature is between 20° C. and 95° C. In other examples, the predetermined temperature is between 60° C. to 80° C. (e.g. 70° C.). For example only, the predetermined period may be 4 to 6 minutes (e.g. 5 minutes). After the predetermined period, the substrate is rinsed. For example only, the substrate may be rinsed using deionized (DI) water or isopropyl alcohol (IPA). After rinsing, the substrate may be blow dry. In some examples, the substrate is blown dry using molecular nitrogen ($N_2$). For further details, see A Thathachary et al., Applied Physics Letter 96, 152108 (2010), which is hereby incorporated by reference in its entirety.

Figure 4I:
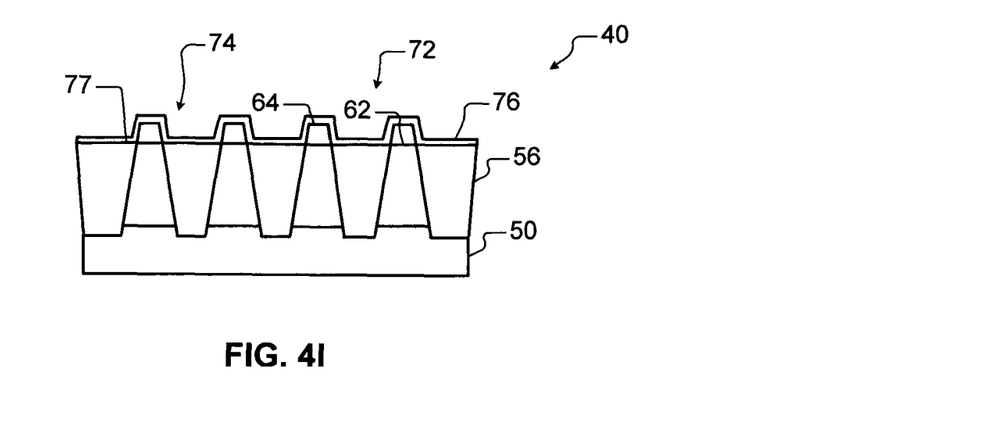
FIG. 4I is a side cross-sectional view of an example of the substrate after the mask film layer is removed and a metal layer is deposited according to the present disclosure.

In FIG. 4I, the substrate 40 is shown after the mask film layer 70 is removed and a metal layer 76 is deposited over the second film 64 associated with the PMOSFETs 72 and NMOSFETs 74 and the STI regions 56. In some examples, a thin oxide film 77 may be deposited before the metal layer 76. In some examples, the oxide film 77 includes $SiO_2$, although other film materials can be used. The metal layer 76 may be patterned during subsequent steps.

Figure 5:
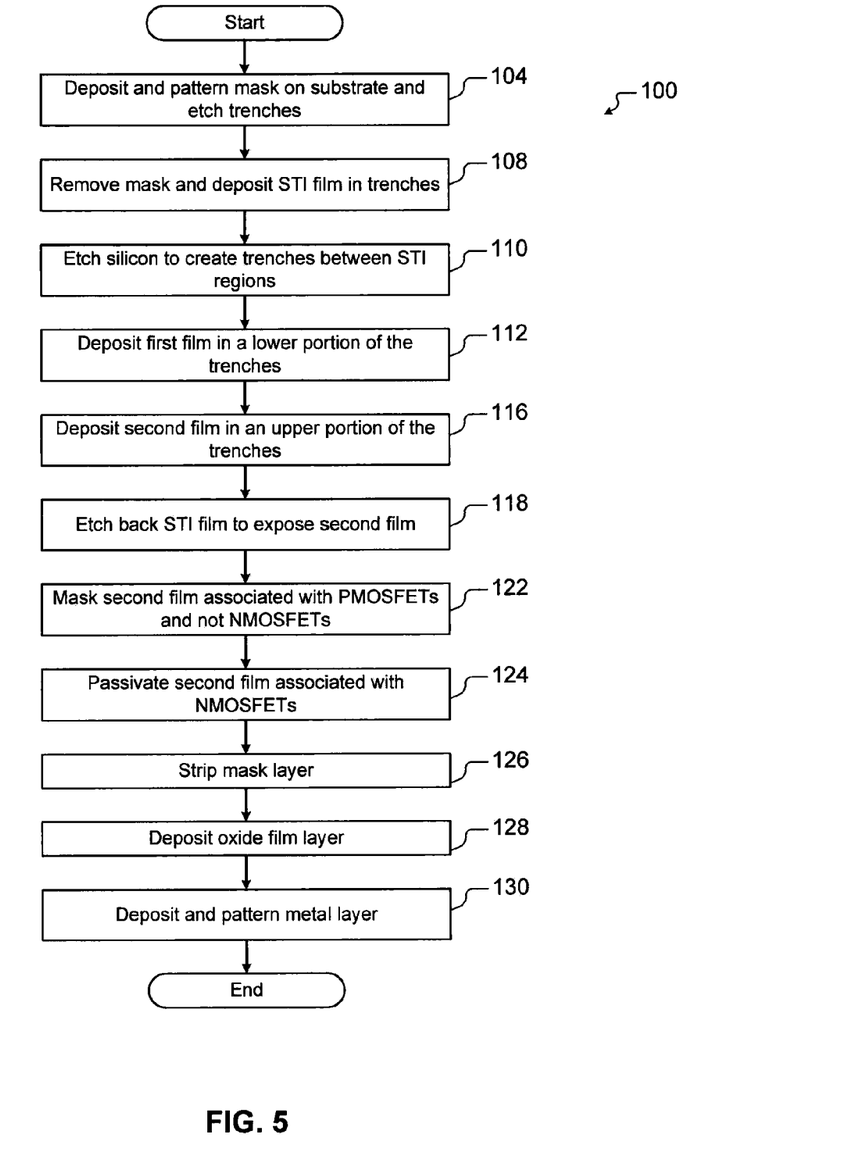
FIG. 5 is a flowchart illustrating steps of an example of a method for making the substrate of FIGS. 4A-4I according to the present disclosure.

Referring now to FIG. 5, a method 100 for making the substrate of FIGS. 4A-4I is shown. At 104, a mask layer is deposited and patterned on the substrate. Trenches are etched in a silicon layer in areas that are not masked. At 108, the mask layer is removed and STI film is deposited in the trenches. At 110, the silicon layer is etched to create trenches between the STI regions. At 112, a first film is deposited in a lower portion of the trenches. For example only, the first film may include relaxed silicon germanium ($Si_{1-x}Ge_x$), although other types of film may be used.

At 116, a second film (such as strained germanium or SiGe having a Ge concentration greater than or equal to 85%) is deposited in an upper portion of the trenches. At 118, the STI film is etched back to expose the strained germanium or SiGe. At 122, the second film portions associated with PMOSFETs is masked. The portions of the second film associated with NMOSFETs remain unmasked. At 124, the second film associated with the NMOSFETs is passivated. At 126, the mask layer is stripped. In some examples, a thin oxide film layer (such as $SiO_2$) is deposited at 128. At 130, a metal layer is deposited and patterned. In some examples, the metal includes aluminum (Al), zirconium (Zr), tungsten (W) or tantalum (Ta), although other materials can be used.

Figure 6A:
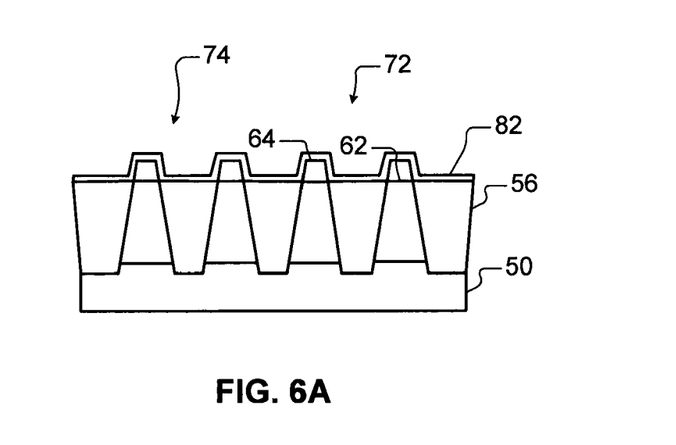
FIG. 6A is a side cross sectional view of an example of the substrate of FIG. 4F after a metal layer is deposited thereon according to the present disclosure.
Figure 6B:
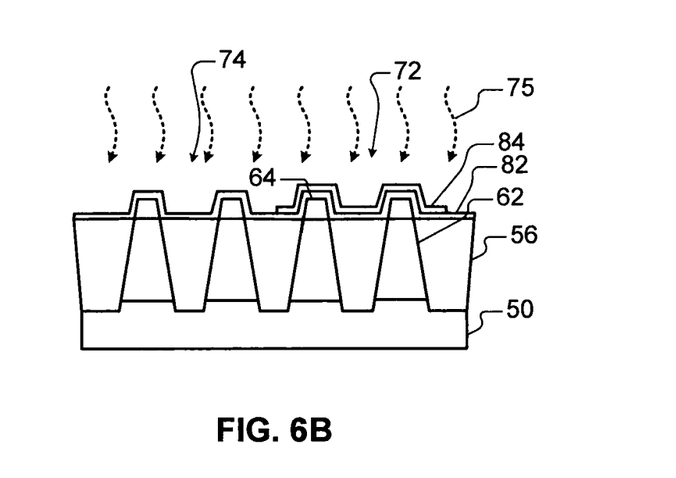
FIG. 6B is a side cross sectional view of an example of the substrate of FIG. 6A including a mask formed on the metal layer over the PMOSFETs and passivation of channels of the NMOSFETs through the metal layer according to the present disclosure.

Referring now to FIG. 6A-6B, passivation of the second film above the NMOSFETs may be performed in another manner. In FIG. 6A, the substrate 40 of FIG. 4F is shown after a metal layer 82 is deposited thereon and before the second film associated with the NMOSFETs is passivated. In some examples, the metal layer 82 includes aluminum (Al), zirconium (Zr), tungsten (W) or tantalum (Ta), although other materials can be used. In FIG. 3B, a mask layer 84 is deposited and patterned on the metal layer 82 over the PMOSFETs but not the NMOSFETs. Passivation 75 of the second film of the NMOSFETs is performed through the metal layer 82.

In some examples, passivation through the metal layer 82 is performed via ion implantation at a sufficiently high enough energy to pass through the metal layer 82. The energy that is used will depend on the thickness of the metal layer 82. In some examples, annealing is performed after the ion implantation to drive the S or Se ions through the metal layer 82. In some examples, the annealing is performed at a temperature less than or equal to 600° C.

Figure 7:
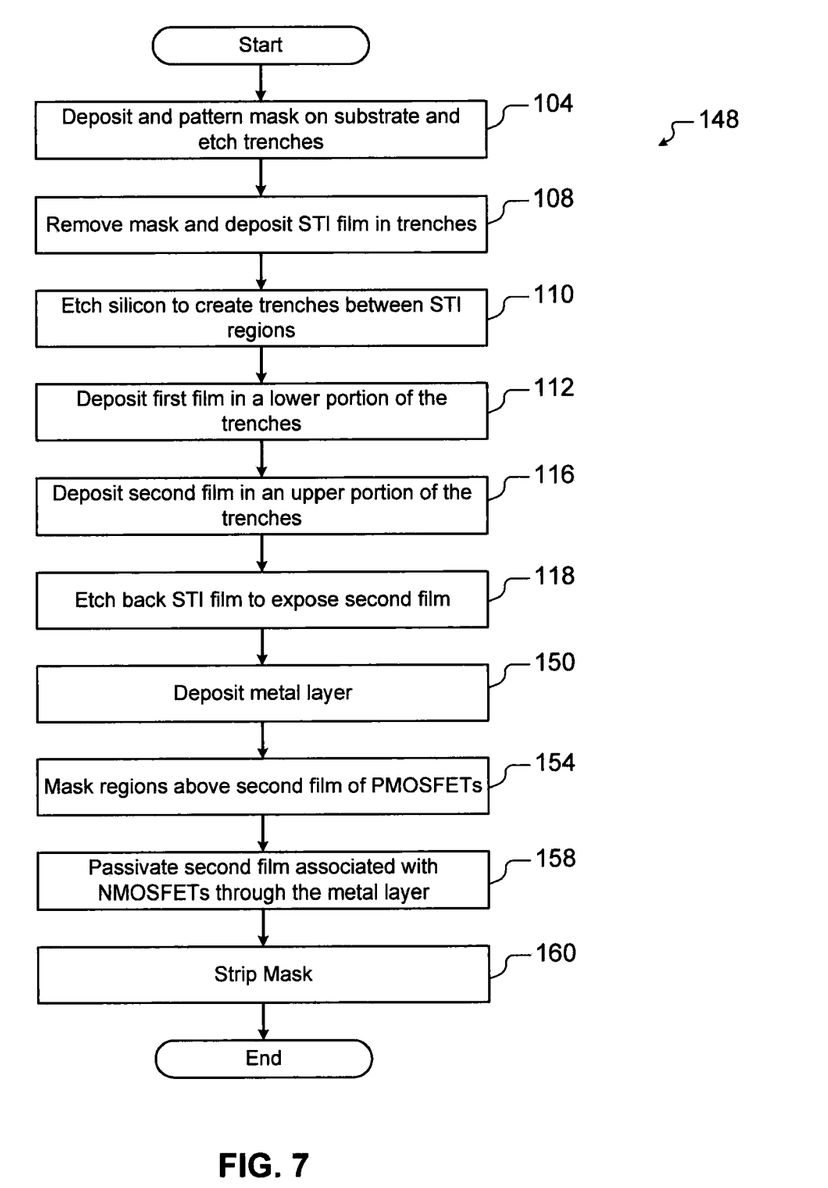
FIG. 7 is a flowchart illustrating steps of an example of a method for making the substrate of FIGS. 6A-6B according to the present disclosure.

Referring now to FIG. 7, a method 148 for making the substrate of FIGS. 6A-6B is shown. After step 118 from FIG. 5, the method continues at 150 and a metal layer is deposited on the substrate. In some examples, the metal includes aluminum (Al), zirconium (Zr), tungsten (W) or tantalum (Ta), although other materials can be used. At 154, a mask layer is patterned and deposited on the substrate to block passivation of the second film associated with PMOSFETs but not NMOSFETs. At 158, the second film associated with the NMOSFETs is passivated through the metal layer. At 160, the mask is stripped.

Figure 8:
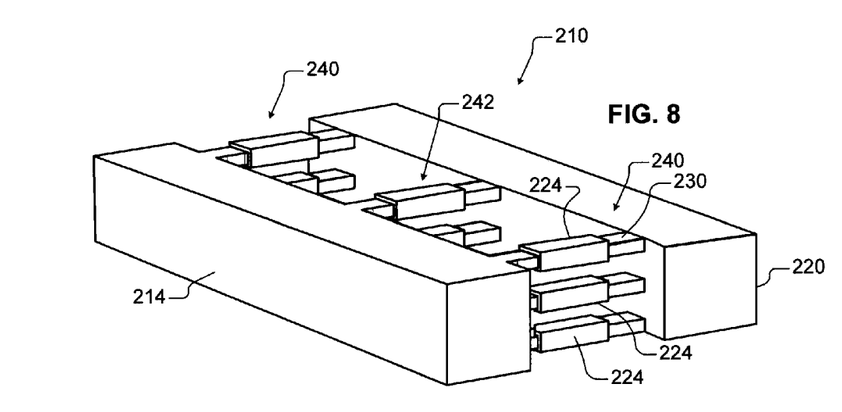
FIGS. 8-10 are perspective views of an example of a gate-all-around transistor according to the present disclosure.
Figure 9:
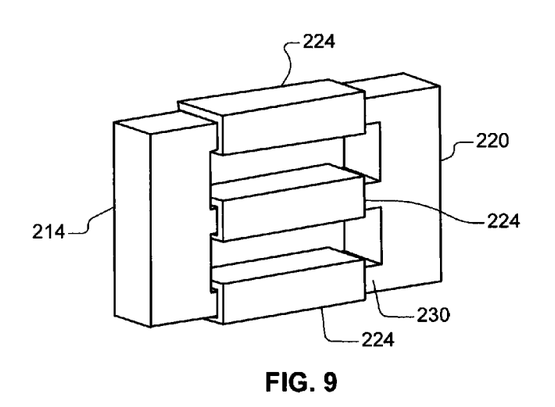
Figure 10:
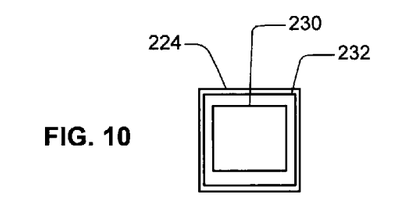

Referring now to FIGS. 8-10, a similar technique may be used for gate-all-around (GAA) transistors 210. In FIGS. 8-9, the GAA transistors 210 include source and drain regions 214 and 220, respectively. Gate regions 224 are formed around channel regions 230 between the source region 214 and the drain region 220. The channel regions 230 may be formed using germanium (Ge) nanowires or SiGe nanowires (with a Ge concentration greater than or equal to 85%). Some of the transistors may be PMOSFETs 240 and some of the transistors may be NMOSFETs 242. In FIG. 10, the channel regions 230 are surrounded by an oxide layer 232 and the gate regions 224.

Prior to depositing a metal gate layer corresponding to the gate regions 224, the Ge or SiGe nanowires in the channel regions 230 corresponding to NMOSFET transistors 242 are passivated as described above. The channel regions 230 corresponding to PMOSFETs 240 are masked before deposition of the metal gate layer in a manner similar to FIGS. 4A-5. In some examples, the metal gate layer includes aluminum (Al), zirconium (Zr), tungsten (W) or tantalum (Ta), although other materials can be used. Alternately, the masking may be performed after deposition of the metal gate layer in a manner similar to FIGS. 6A-7.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for making an integrated circuit, comprising:
   a) providing a substrate including n-type metal oxide semiconductor field effect transistors (NMOSFETs) and p-type metal oxide semiconductor field effect transistors (PMOSFETs), wherein channel regions of the NMOSFETs and the PMOSFETs include germanium;
   b) depositing and patterning a mask layer to mask the channel regions of the PMOSFETs and to not mask the channel regions of the NMOSFETs;
   c) passivating an exposed surface of the substrate;
   d) removing the mask layer; and
   e) depositing a metal contact layer on both the NMOSFETs and the PMOSFETs,
   wherein passivating the substrate comprises performing a substrate treatment selected from a group consisting of ammonium sulfide (($NH_4$)$_2$S) and thiol-based self-assembled monolayers (SAMs).

2. The method of claim 1, wherein the PMOSFETS and the NMOSFETs include FINFETs.

3. The method of claim 1, wherein the PMOSFETS and the NMOSFETs include gate all around (GAA) transistors.

4. The method of claim 1, wherein the channel regions include strained germanium.

5. The method of claim 1, wherein the channel regions include silicon germanium (SiGe) having a germanium concentration greater than or equal to 85%.

6. A method for making an integrated circuit, comprising:
   a) providing a substrate including n-type metal oxide semiconductor field effect transistors (NMOSFETs) and p-type metal oxide semiconductor field effect transistors (PMOSFETs), wherein channel regions of the NMOSFETs and the PMOSFETs include germanium;
   b) depositing and patterning a mask layer to mask the channel regions of the PMOSFETs and to not mask the channel regions of the NMOSFETs;
   c) passivating an exposed surface of the substrate;
   d) removing the mask layer; and
   e) depositing a metal contact layer on both the NMOSFETs and the PMOSFETs,
   wherein passivating the substrate comprises performing a substrate treatment using a liquid selected from a group consisting of dissolved selenium chloride, selenium oxyfluoride and selenium oxychloride.

7. The method of claim 6, wherein the PMOSFETS and the NMOSFETs include FINFETs.

8. The method of claim 6, wherein the PMOSFETS and the NMOSFETs include gate all around (GAA) transistors.

9. The method of claim 6, wherein the channel regions include strained germanium.

10. The method of claim 6, wherein the channel regions include silicon germanium (SiGe) having a germanium concentration greater than or equal to 85%.

11. A method for making an integrated circuit, comprising:
    a) providing a substrate including n-type metal oxide semiconductor field effect transistors (NMOSFETs) and p-type metal oxide semiconductor field effect transistors (PMOSFETs), wherein channel regions of the NMOSFETs and the PMOSFETs include germanium;
    b) depositing and patterning a mask layer to mask the channel regions of the PMOSFETs and to not mask the channel regions of the NMOSFETs;
    c) passivating an exposed surface of the substrate;
    d) removing the mask layer; and
    e) depositing a metal contact layer on both the NMOSFETs and the PMOSFETs,
    wherein passivating the substrate comprises exposing the substrate to plasma gas chemistry selected from a group consisting of hydrogen sulfide ($H_2S$) and hydrogen selenide ($H_2Se$).

12. The method of claim 11, wherein the PMOSFETS and the NMOSFETs include FINFETs.

13. The method of claim 11, wherein the PMOSFETS and the NMOSFETs include gate all around (GAA) transistors.

14. The method of claim 11, wherein the channel regions include strained germanium.

15. The method of claim 11, wherein the channel regions include silicon germanium (SiGe) having a germanium concentration greater than or equal to 85%.

16. A method for making an integrated circuit, comprising:
    a) providing a substrate including n-type metal oxide semiconductor field effect transistors (NMOSFETs) and p-type metal oxide semiconductor field effect transistors (PMOSFETs), wherein channel regions of the NMOSFETs and the PMOSFETs are made of germanium;
    b) depositing a metal contact layer made of a single metal material over the channel regions of both the NMOSFETs and the PMOSFETs;
    c) depositing and patterning a mask layer on the metal contact layer to mask the channel regions of the PMOSFETs and to not mask the channel regions of the NMOSFETs; and
    d) passivating the channel regions of the NMOSFETs and not passivating the channel regions of the PMOSFETs.

17. The method of claim 16, further comprising removing the mask layer.

18. The method of claim 16, further comprising, after a) and before b), depositing an oxide film on the channel regions of the NMOSFETs and the PMOSFETs.

19. The method of claim 16, wherein passivating the channel regions of the NMOSFETs comprises implanting ions selected from a group consisting of sulfur ions and selenium ions in the channel regions of the NMOSFETs through the metal layer.

20. The method of claim 16, wherein the PMOSFETS and the NMOSFETs include FINFETs.

21. The method of claim 16, wherein the PMOSFETS and the NMOSFETs include gate all around (GAA) transistors.

22. The method of claim 16, wherein the channel regions include strained germanium.

23. The method of claim 16, wherein the channel regions include silicon germanium (SiGe) having a germanium concentration greater than or equal to 85%.

* * * * *